US006584422B2

(12) United States Patent
Bhaumik et al.

(10) Patent No.: US 6,584,422 B2
(45) Date of Patent: Jun. 24, 2003

(54) METHOD AND APPARATUS FOR OPTIMIZING CORNER FREQUENCY CALIBRATION OF A TUNABLE FILTER USING A PROGRAMMABLE DIODE

(75) Inventors: Jaydip Bhaumik, Rochester, MN (US); Raymond Alan Richetta, Rochester, MN (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 180 days.

(21) Appl. No.: 09/864,514

(22) Filed: May 24, 2001

(65) Prior Publication Data

US 2002/0177966 A1 Nov. 28, 2002

(51) Int. Cl.[7] ........................ G01R 35/00; G11B 5/035; G11B 5/09

(52) U.S. Cl. ......................... 702/107; 702/106; 360/46; 360/65; 327/552; 327/553

(58) Field of Search .............................. 702/64, 69, 75, 702/76, 85, 105–107, 117, 189, 190, 197; 360/65, 46; 327/552, 553; 333/17.1, 174; 708/322

(56) References Cited

U.S. PATENT DOCUMENTS 4,513,260 A * 4/1985 Ragan ........................ 333/165
5,136,267 A * 8/1992 Cabot ......................... 333/174
5,760,641 A * 6/1998 Granger-Jones et al. .... 327/553
6,429,988 B1 * 8/2002 Bhaumik et al. ............. 360/46
6,441,983 B1 * 8/2002 Philpott et al. ............... 360/67
6,469,856 B1 * 10/2002 Mitchell et al. .............. 360/65

FOREIGN PATENT DOCUMENTS

DE 4239140 C1 * 3/1994 ........... H01L/23/58

* cited by examiner

*Primary Examiner*—Marc S. Hoff
*Assistant Examiner*—Manuel L. Barbee
(74) *Attorney, Agent, or Firm*—Joan Pennington

(57) ABSTRACT

A method and apparatus are provided for optimizing calibration of a tunable filter over a wide range of frequencies in a data channel of a direct access storage device (DASD). Calibration codes are received for low corner frequency, banding, and high corner frequency. A programmable diode is provided with a DC portion and a tunable digital-to-analog converter (DAC). A calibration control current is generated for calibrating the tunable filter utilizing the programmable diode and the calibration codes. The programmable diode is used to vary the calibration control current to calibrate the tunable filter to a correct low corner frequency and high corner frequency. The programmable diode can be programmed over a large range.

20 Claims, 3 Drawing Sheets

METHOD AND APPARATUS FOR OPTIMIZING CORNER FREQUENCY CALIBRATION OF A TUNABLE FILTER USING A PROGRAMMABLE DIODE

FIELD OF THE INVENTION

The present invention relates generally to the data processing field, and more particularly, relates to a method and apparatus for optimizing corner frequency calibration of a tunable filter over a wide range of frequencies in a data channel of a direct access storage device (DASD).

DESCRIPTION OF THE RELATED ART

Direct access storage devices (DASDs) often incorporating stacked, commonly rotated rigid magnetic disks are used for storage of data in magnetic form on the disk surfaces. Data is recorded in concentric, radially spaced data information tracks arrayed on the surfaces of the disks. Transducer heads driven in a path toward and away from the drive axis write data to the disks and read data from the disks. Typically servo information is provided on one or more disk surfaces for reading by the transducer heads for accurately and reliably positioning transducer heads on the disk surfaces at a specific location to read and write data.

In complementary metal oxide semiconductor (CMOS) technologies the process variations can be made very easily to tune the process to be faster or slower as the need may be. This kind of predictable as well as controlled variation affects analog circuits the most. In the DASD data channel, a tunable filter, such as a low pass continuous time filter (CTF) used for filtering readback signals, is especially sensitive to such changes. This filter must operate over a wide range of frequencies from a low frequency servo readback signal to a high frequency data readback signal. For example, the servo readback signal can be a 40 MHz signal and the data readback signal can be a 325 MHz signal.

As channel speeds go faster, conventional arrangements of circuit functions can be a limiting factor in overall performance. In the design of new DASDs, the performance requirements can be more demanding than the data channel can deliver with traditional architectures.

A need exist for an improved mechanism for optimizing calibration of a corner frequency of a tunable filter over a wide range of frequencies in a data channel of a direct access storage device (DASD). Corner frequency calibration (CFC) takes the place of fuse trims in older technologies. Corner frequency calibration leads to tremendous test and technology savings over fuse trims.

SUMMARY OF THE INVENTION

A principal object of the present invention is to provide a method and apparatus for optimizing calibration of a corner frequency of a tunable filter over a wide range of frequencies in a data channel of a direct access storage device (DASD). Other important objects of the present invention are to provide such methods and apparatus for optimizing corner frequency calibration substantially without negative effect and that overcome many of the disadvantages of prior art arrangements.

In brief, a method and apparatus are provided for optimizing calibration of a tunable filter over a wide range of frequencies in a data channel of a direct access storage device (DASD). Calibration codes are received for low corner frequency, banding, and high corner frequency. A programmable diode is provided with a DC portion and a tunable digital-to-analog converter (DAC). A calibration control current is generated for calibrating the tunable filter utilizing the programmable diode and the calibration codes.

In accordance with features of the invention, the programmable diode is used to vary the calibration control current to calibrate the tunable filter to a correct low corner frequency and high corner frequency. The programmable diode can be programmed over a large range.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
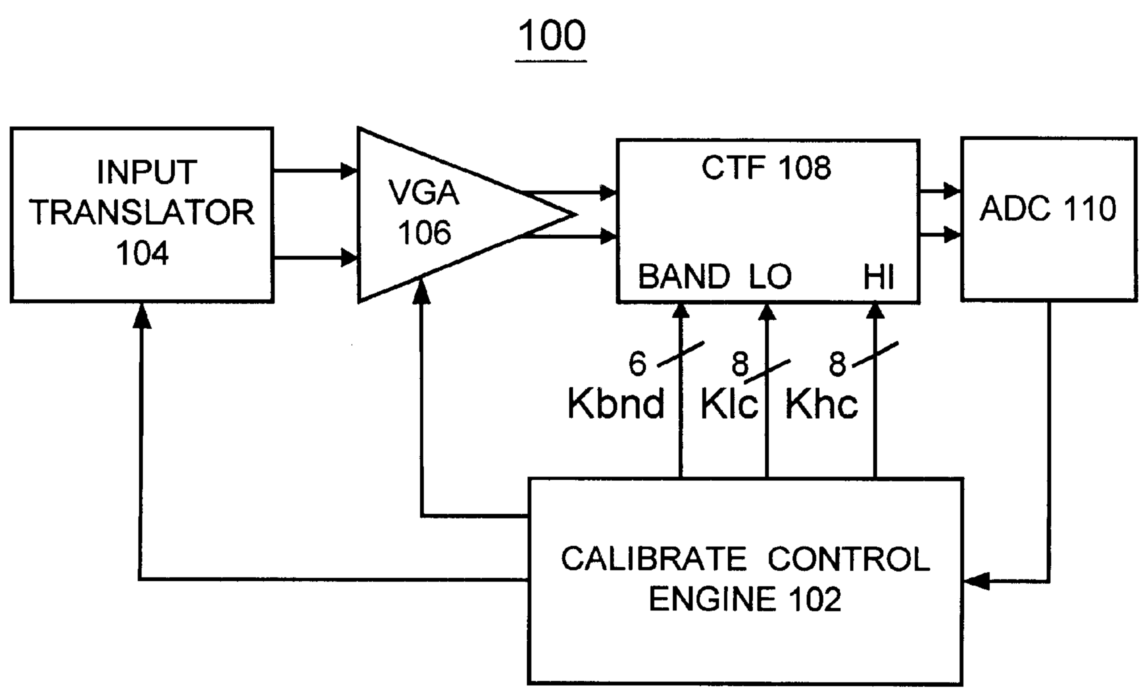
FIG. 1 is a block diagram representation illustrating a direct access storage device (DASD) system for implementing methods for calibrating a corner frequency of a tunable filter in a direct access storage device in accordance with the preferred embodiment.

Having reference now to the drawings, in FIG. 1, there is shown a direct access storage device (DASD) calibration system of the preferred embodiment generally designated by the reference character 100. DASD system 100 includes a calibrate control engine 102 of the preferred embodiment. Calibrate control engine 102 is arranged for implementing a method for calibrating low corner frequency and high corner frequency of a tunable filter. Tunable filter calibration is provided by the calibrate control engine 102 using a programmable diode for controlling a calibration control current for high calibration codes, low calibration codes and band calibration codes.

As shown in FIG. 1, calibrate control engine 102 controls an input translator 104 in the DASD calibration system 100. An input signal generated by the input translator 104 is applied to a variable gain amplifier (VGA) 106 and the amplified input signal is applied to a continuous time filter (CTF) 108. During normal operation of the DASD, the read signal is applied to the VGA 106 and the amplified read signal is applied to the CTF 108. Control signals are applied by the calibrate control engine 102 to the input translator 104 and the VGA 106 during calibration of the CTF 108. As shown in FIG. 1, calibrate control engine 102 applies 8-bit high calibration codes Khc and 8-bit low calibration codes Klc and 6-bit band calibration codes Kbnd to calibrate the CTF 108.

Figure 2:
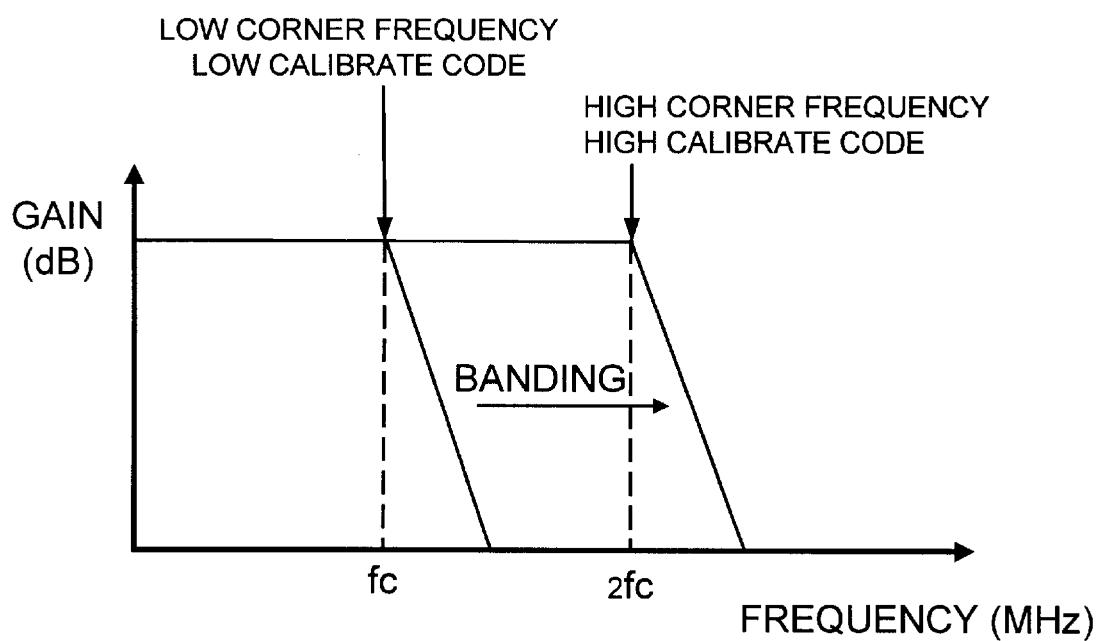
FIG. 2 is a chart illustrating a low corner frequency, banding, and a high corner frequency of a tunable filter for optimizing calibration of the tunable filter in accordance with the preferred embodiment.

FIG. 2 illustrates a low corner frequency and a high corner frequency of a tunable filter respectively shown with a LOW CALIBRATE code and a HIGH CALIBRATE code for optimizing calibration of the tunable filter 108 in accordance with the preferred embodiment. The LOW CALIBRATE codes are used to set the filter to the low corner frequency or the 3 dB point of the tunable filter. As shown, banding is, for example, 2:1. Setting the filter to the low corner frequency or the 3 dB point of the tunable filter is done with the BAND set to zero. The HIGH CALIBRATE codes are used to tune the filter to the correct high corner frequency. Tuning the filter 108 to the correct high corner frequency is done with the BAND set, for example, to 63.

Figure 3:
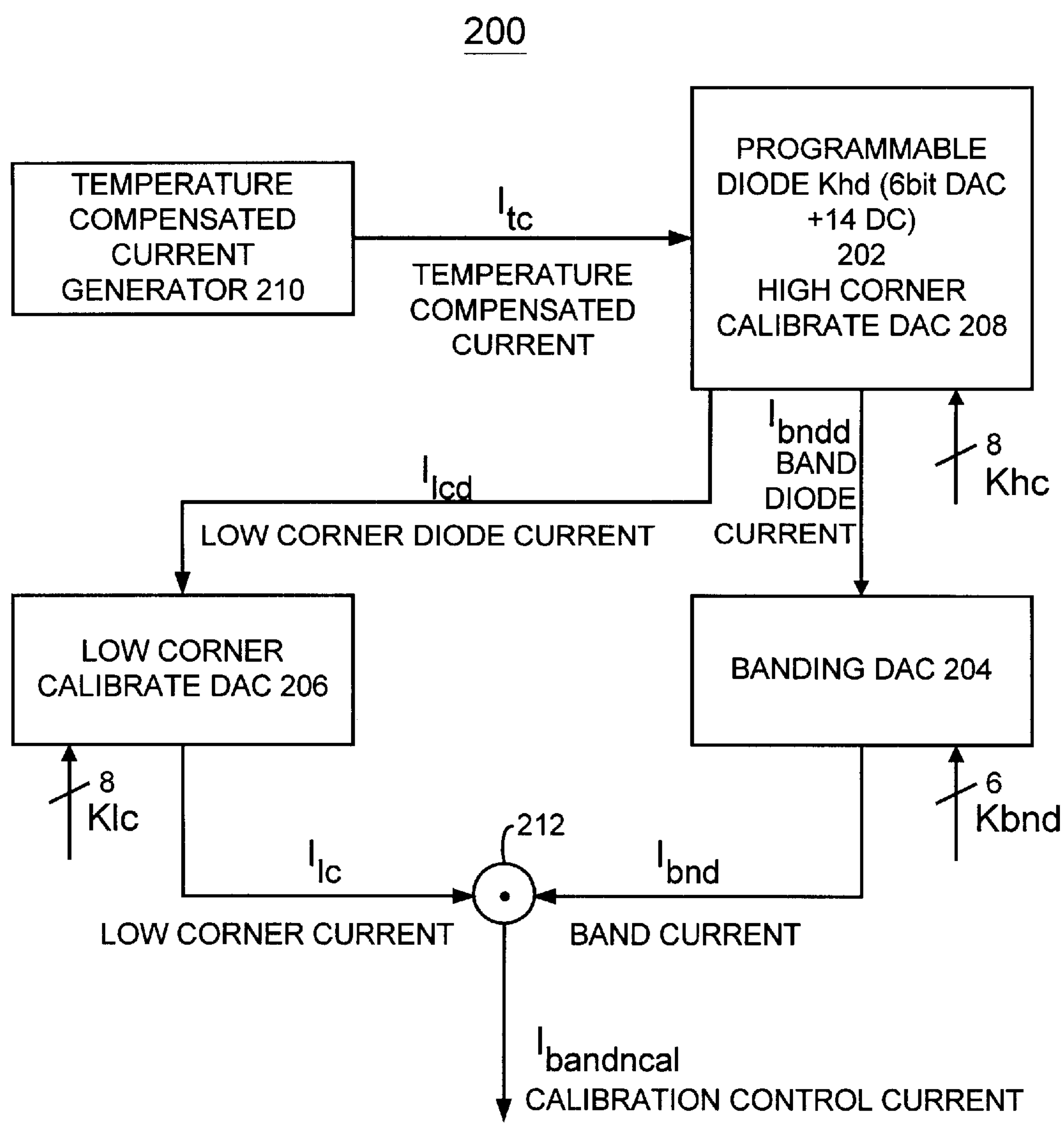
FIG. 3 is a block diagram illustrating a calibration current control circuit for optimizing calibration of a tunable filter in accordance with the preferred embodiment.

Referring now to FIG. 3, there is shown a calibration control current circuit for optimizing calibration of a tunable filter, such as CTF 108 in accordance with the preferred embodiment generally designated by the reference character 200.

In accordance with features of the preferred embodiment, a programmable diode 202 is used for optimizing calibration of CTF 108 over a wide range of frequencies. The programmable diode 202 has a DC portion and a tunable 6-bit digital-to-analog converter (DAC). The programmable diode 202 controls the calibration control current for HIGH CALIBRATE codes, LOW CALIBRATE codes, and BAND codes for optimizing calibration of the tunable filter 108. A BAND current is controlled by a 6-bit BANDING DAC 204. The HIGH CORNER CALIBRATE and the LOW CORNER CALIBRATE are controlled by a pair of 8-bit DACs 206 and 208 respectively receiving LOW CALIBRATE codes Klc and HIGH CALIBRATE codes Khc. LOW CALIBRATE codes Klc and HIGH CALIBRATE codes Khc are used to tune the filter 108 to the correct low corner frequency and high corner frequency.

As shown in FIG. 3, a temperature compensated current generator 210 applies a temperature compensated current $I_{tc}$ to the programmable diode 202. Temperature compensated current generator 210 generates the temperature compensated current $I_{tc}$, for example, using a polysilicon resistor. The programmable diode 202 applies a low corner diode current $I_{lcd}$ to the LOW CORNER CALIBRATE DAC 206 and applies a band diode current $I_{bndd}$ to the BANDING DAC 204. A low calibration current $I_{lc}$ output of the LOW CORNER CALIBRATE DAC 206 and a band current $I_{bnd}$ output of the BANDING DAC 204 are added at summing node 212 to create a calibration control current $I_{bandncal}$ for low corner frequency, banding, and high low corner frequency calibration codes.

The programmable diode 202 can be programmed, for example, from 14 to (0 to 63+14) or a maximum of 77. Thus, the range of this programmable diode 202 is 5.5 to 1. The low corner diode current $I_{lcd}$ can be expressed by the following equation 1:

$$I_{lcd}=(I_{tc}*48)/(K_{hd}+14) \quad (1)$$

where $I_{tc}$ is the temperature compensated current, and $K_{hd}$ is the diode size, for example, between 0 and 63 of the programmable diode 202. The size of the diode generating the low corner diode current $I_{lcd}$ from the temperature compensated current $I_{tc}$ is 48×, and hence the factor of 48 times $I_{tc}$. The low corner diode current $I_{lcd}$ is used to create the low calibration current $I_{lc}$ represented by the following equation 2:

$$I_{lc}=(I_{lcd}*K_{lc})/52 \quad (2)$$

where $K_{lc}$ is the low corner calibration code, for example, between 0 and 255, while 52 is an example size of the unit diode receiving the low corner diode current $I_{lcd}$. The low calibration current $I_{lc}$ can be rewritten in terms of the temperature compensated current $I_{tc}$ represented by the following equation 3:

$$I_{lc}=(I_{tc}*48*K_{lc})/((K_{hd}+14)*52) \quad (3)$$

The band diode current $I_{bndd}$ created from the temperature compensated current $I_{tc}$ through a unit device and multiplied by the high corner calibrate code $K_{hc}$, for example, between 0 and 255, can be represented by the following equation 4:

$$I_{bndd}=(I_{tc}*K_{hc})/(K_{hd}+14) \quad (4)$$

The band diode current $I_{bndd}$ is then multiplied by the band calibrate code $K_{bnd}$, and divided by the size of the diode receiving the band diode current $I_{bndd}$ which is for example, 44. The band current $I_{bnd}$ is represented by the following equation 5:

$$I_{bnd}=I_{bndd}*(K_{bnd}/44) \quad (5)$$

In terms of the temperature compensated current $I_{tc}$, the band current $I_{bnd}$ is represented by the following equation 6:

$$I_{bnd}=(I_{tc}*K_{hc}*K_{bnd})/((K_{hd}+14)*44) \quad (6)$$

The two currents $I_{bnd}$ and $I_{lc}$ are then added to create the calibration control current that can be expressed in terms of the temperature compensated current $I_{tc}$. The current $I_{bandncal}$ is represented by the following equation 7:

$$I_{bandncal}=(I_{tc}/(K_{hd}+14))*(((K_{lc}*48)/52)+(K_{hc}*K_{bnd})/44) \quad (7)$$

Thus, having the diode size $K_{hd}$ term in the equation 7, provides the ability to optimize $K_{lc}$ and $K_{hc}$ to get the appropriate corner.

It should be understood that the unit diode size numbers 48, 52, 44 can be changed to support a particular disk drive 100. It is important to note that the low corner frequency calibration is independent of the high corner frequency calibration. This results because $K_{bnd}$ is set to zero when calibrating the low corner. Since the temperature compensated current $I_{tc}$ is generated using a polysilicon resistor based current, if it is higher or lower than nominal, then the programmable diode size $K_{hd}$ can be changed accordingly to get the same low and high calibration code. This can be understood from the following example. When the $K_{bnd}$ is set to zero, then the current $I_{bandncal}$ is represented by the following equation 8:

$$I_{bandncal}(\text{low})=(I_{tc}*48*K_{lc})/((K_{hd}+14)/52) \quad (8)$$

When the $K_{bnd}$ is set to 63, then the current $I_{bandncal}$ is represented by the following equation 9:

$$I_{bandncal}(\text{high})=(I_{tc}*K_{hc}*\ 63)/((K_{hd}+14)*44)+I_{bandncal}(\text{low}) \quad (9)$$

Then the ratio of $I_{bandncal}$(high) to $I_{bandncal}$(low) can be expressed by the following equation 10:

$$K=I_{bandncal}(\text{high})/I_{bandncal}(\text{low})=1.55*(K_{hc}/K_{lc})+1 \quad (10)$$

So depending on the values of $K_{hc}$ and $K_{lc}$ the ratio K can be varied over a very wide range.

The programmable diode 202 is useful to center the calibration codes, and the programmable diode 202 also supports lower or higher data rates within reasonable limits. The programmable diode 202 provides an extra parameter to optimize the filter 108.

While the present invention has been described with reference to the details of the embodiments of the invention shown in the drawing, these details are not intended to limit the scope of the invention as claimed in the appended claims.

What is claimed is:

1. A method for optimizing calibration of a tunable filter in a direct access storage device comprising the steps of:

receiving calibration codes for low corner frequency, banding, and high corner frequency;

providing a programmable diode with a DC portion and a tunable digital-to-analog converter (DAC);

generating a calibration control current for calibrating the tunable filter utilizing said programmable diode together with said calibration codes.

2. A method for optimizing calibration of a tunable filter in a direct access storage device as recited in claim 1 wherein the step of receiving calibration codes for low corner frequency, banding, and high corner frequency includes the step of providing a calibration control engine, said calibration control engine providing said calibration codes.

3. A method for optimizing calibration of a tunable filter in a direct access storage device as recited in claim 1 wherein the step of providing said programmable diode with said DC portion and said tunable digital-to-analog converter (DAC) includes the step of providing said programmable diode with a small DC portion and a tunable 6-bit digital-to-analog converter (DAC).

4. A method for optimizing calibration of a tunable filter in a direct access storage device as recited in claim 3 wherein the step of providing said programmable diode with a small DC portion and a tunable 6-bit digital-to-analog converter (DAC) includes the step of providing said programmable diode with a range greater than five to one.

5. A method for optimizing calibration of a tunable filter in a direct access storage device as recited in claim 3 wherein the step of providing said programmable diode said tunable 6-bit digital-to-analog converter (DAC) includes the step of providing said programmable diode with said tunable 6-bit digital-to-analog converter (DAC) enables a programmable value in a range between 0 and 63.

6. A method for optimizing calibration of a tunable filter in a direct access storage device as recited in claim 1 wherein the step of generating said calibration control current for calibrating the tunable filter utilizing said programmable diode together with said calibration codes includes the step of generating a temperature compensated current, and applying said temperature compensated current to said programmable diode for generating said calibration control current.

7. A method for optimizing calibration of a tunable filter in a direct access storage device as recited in claim 6 wherein the step of generating said calibration control current for calibrating the tunable filter utilizing said programmable diode together with said calibration codes includes the step of generating a low corner diode current from said temperature compensated current applied to said programmable diode.

8. A method for optimizing calibration of a tunable filter in a direct access storage device as recited in claim 7 wherein said low corner diode current $I_{lcd}$ is represented by $$I_{lcd}=(I_{tc}*48)/(K_{hd}+14)$$

where $I_{tc}$ represents said temperature compensated current, $K_{hd}$ is a tunable diode size of said programmable diode; 14 represents said DC portion of said programmable diode and 48 represents one device size value.

9. A method for optimizing calibration of a tunable filter in a direct access storage device as recited in claim 8 wherein the step of generating said calibration control current for calibrating the tunable filter utilizing said programmable diode together with said calibration codes includes the step of generating a low corner current from said low corner diode current with said low corner diode current being multiplied by a low corner calibration code and divided by a unit diode size receiving said low corner diode current.

10. A method for optimizing calibration of a tunable filter in a direct access storage device as recited in claim 9 wherein said low corner current $I_{lc}$ is represented by $$I_{lc}=(I_{tc}*48*K_{lc})/((K_{hd}+14)*52),$$

where 52 represents said unit diode size receiving said low corner diode current and $K_{lc}$ represents said low corner calibration code.

11. A method for optimizing calibration of a tunable filter in a direct access storage device as recited in claim 7 wherein the step of generating said calibration control current for calibrating the tunable filter utilizing said progammable diode together with said calibration codes includes the step of generating a band diode current from said temperature compensated current applied to said programmable diode; said temperature compensated current being multiplied by a high corner calibration code to create said band diode current.

12. A method for optimizing calibration of a tunable filter in a direct access storage device as recited in claim 11 wherein said band diode current $I_{bndd}$ is represented by $$I_{bndd}=(I_{tc}*K_{hc})/(K_{hd}+14)$$

where $I_{tc}$ represents said temperature compensated current, $K_{hd}$ represents a tunable diode size of said programmable diode; 14 represents said DC portion of said programmable diode and $K_{hc}$ represents said high corner calibration code.

13. A method for optimizing calibration of a tunable filter in a direct access storage device as recited in claim 12 wherein the step of generating said calibration control current for calibrating the tunable filter utilizing said progammable diode together with said calibration codes includes the step of generating a band current by multiplying said band diode current $I_{bndd}$ by a band calibration code and dividing by a diode size receiving said band diode current $I_{bndd}$.

14. A method for optimizing calibration of a tunable filter in a direct access storage device as recited in claim 13 wherein said band current $I_{bnd}$ is represented by:

$$I_{bnd}=(I_{tc}*K_{hc}*K_{bnd})/((K_{hd}+14)*44),$$

where $K_{bnd}$ represents said high corner calibration code and 44 represents said diode size receiving said band diode current $I_{bndd}$.

15. A method for optimizing calibration of a tunable filter in a direct access storage device as recited in claim 10 wherein the step of generating a calibration control current for calibrating the tunable filter utilizing said programmable diode together with said calibration codes includes the step of generating said low corner current $I_{lc}$ for calibrating a low corner frequency of the tunable filter.

16. A method for optimizing calibration of a tunable filter in a direct access storage device as recited in claim 15 wherein the step of generating a calibration control current for calibrating the tunable filter utilizing said programmable diode together with said calibration codes includes the step of adding said band current $I_{bnd}$ and said low corner current $I_{lc}$ for generating said calibration control current.

17. A method for optimizing calibration of a tunable filter in a direct access storage device as recited in claim 16 wherein said calibration control current is represented by:

$$I_{bandncal}=(I_{tc}/(K_{hd}+14))*(((K_{lc}*48)/52)+(K_{hc}*K_{bnd})/44)).$$

18. Apparatus for optimizing calibration of a tunable filter in a direct access storage device comprising:

a calibration control engine for providing calibration codes for low corner frequency, banding, and high corner frequency;

a calibration control current circuit including a programmable diode with a DC portion and a tunable digital-to-analog converter (DAC);

said calibration control current circuit for generating a calibration control current for calibrating the tunable filter utilizing said programmable diode together with said calibration codes.

19. Apparatus for optimizing calibration of a tunable filter in a direct access storage device as recited in claim 18 wherein said calibration control current circuit includes a temperature compensated current generator for generating a temperature compensated current and applying said temperature compensated current to said programmable diode for generating said calibration control current.

20. Apparatus for optimizing calibration of a tunable filter in a direct access storage device as recited in claim 18 wherein said calibration control current circuit includes a low corner calibrate digital-to-analog converter (DAC), a banding digital-to-analog converter (DAC), and a high corner calibrate digital-to-analog converter (DAC) for respectively controlling said calibration control current for low corner frequency, banding, and high corner frequency.

* * * * *